United States Patent
Koren (10) Patent No.: US 8,174,314 B2
(45) Date of Patent: May 8, 2012

(54) APARATUS AND A METHOD FOR PROCESSING AND AMPLIFYING A SIGNAL

(75) Inventor: Doron Koren, Kefar Sirkin (IL)

(73) Assignee: Vyycore Ltd., Petah Tikva, IL (US)

( * ) Notice: Subject to any disclaimer, the term of this patent is extended or adjusted under 35 U.S.C. 154(b) by 0 days.

(21) Appl. No.: 12/634,718

(22) Filed: Dec. 10, 2009

(65) Prior Publication Data

US 2011/0140780 A1    Jun. 16, 2011

(51) Int. Cl.
*H03F 1/30* (2006.01)
(52) U.S. Cl. .......................................................... 330/149
(58) Field of Classification Search .............. 330/2, 149; 375/296, 297
See application file for complete search history.

(56) References Cited

U.S. PATENT DOCUMENTS

7,577,408 B2 *  8/2009  Muller et al. .............. 455/114.3
* cited by examiner

*Primary Examiner* — Robert Pascal
*Assistant Examiner* — Khiem Nguyen
(74) *Attorney, Agent, or Firm* — Reches Patents (57) ABSTRACT

A method and an apparatus. The apparatus includes at least one sensor for sensing at least one parameter that affects a non-linearity of the non-linear amplifier and for generating at least one parameter indicator; a memory module for storing multiple sets of pre-distortion coefficient values; a retrieval module, coupled to the memory module, for receiving the at least one indicator, for selecting a selected set of pre-distortion coefficient values based on the at least one indicator, and for sending the selected set of pre-distortion coefficient values to a signal processing module; and a signal processing module, configured to receive an input signal, to receive the selected set of pre-distortion coefficient values, and to pre-distort the input signal, using the selected set of pre-distortion coefficient values such as to at least partly compensate for the non-linearity of the non-linear amplifier.

20 Claims, 5 Drawing Sheets

APARATUS AND A METHOD FOR PROCESSING AND AMPLIFYING A SIGNAL

BACKGROUND OF THE INVENTION

Power amplifiers which amplify electric signals may be characterized by non-linearity of the amplification, usually (though not necessarily) when the signal inputted to the amplifier comes closer to a saturation threshold of the amplifier. The non-linearity is indicative of a deviation of the amplification process from a linear amplification process during which the amplification involves amplifying an input signal by a constant amplification factor.

Preprocessing of the input signal before it reaches the amplifier (also known as pre-distorting) may be implemented to overcome such non-linearity. However, prior art solutions for pre-distorting a signal before amplification are slow, cumbersome, requires a great computational power, and/or not sufficiently effective. There is therefore a great need for simple and effective means of amplification. In addition existing pre-distortion solution requires reviver linearity that is far better then the amplifier that its non-linearity is being amended. This results in tremendous design requirements for the receiver that result in a very expensive solution.

SUMMARY

A method is provided. The method includes: sensing at least one parameter that affects a non-linearity of a non-linear amplifier; receiving, by a retrieval module, at least one indicators that are indicative of a sensed value of the at least one parameter; selecting one set of pre-distortion coefficient values, from a group of predetermined pre-distortion coefficient value sets, based on the at least one indicators; sending the selected set of pre-distortion coefficient values to a signal processing module; pre-distorting an input signal by the signal processing module, while utilizing the selected set of pre-distortion coefficient values such as to at least partly compensate for the non-linearity of the non-linear amplifier and to provide a pre-distorted signal; and amplifying the pre-distorted signal, by the non-linear amplifier, to provide an amplified signal.

An apparatus is provided. The apparatus includes: at least one sensor for sensing at least one parameter that affects a non-linearity of the non-linear amplifier and for generating at least one parameter indicator; a memory module for storing multiple sets of pre-distortion coefficient values; a retrieval module, coupled to the memory module, for receiving the at least one indicator, for selecting a selected set of pre-distortion coefficient values based on the at least one indicator, and for sending the selected set of pre-distortion coefficient values to a signal processing module; and a signal processing module, configured to receive an input signal, to receive the selected set of pre-distortion coefficient values, and to pre-distort the input signal, using the selected set of pre-distortion coefficient values such as to at least partly compensate for the non-linearity of the non-linear amplifier.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 1:
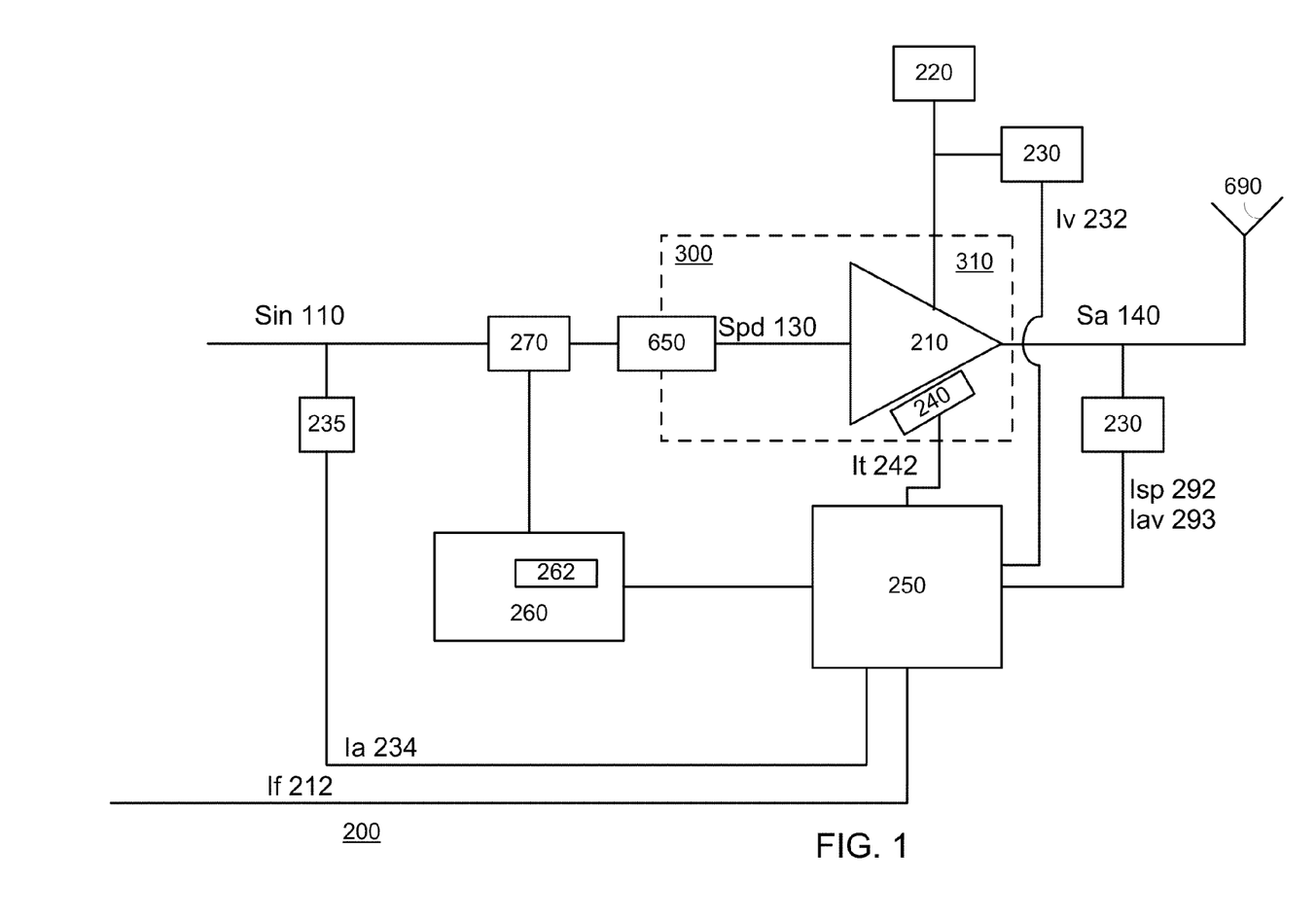
FIG. 1 illustrates an apparatus, according to an embodiment of the invention.

FIG. 1 illustrates apparatus 200, according to an embodiment of the invention.

Apparatus 200 includes: (i) non-linear amplifier 210 for amplifying a pre-distorted signal (Spd 130) to provide an amplified signal (Sa 140); (ii) a temperature sensor 240 for sensing a temperature of the non-linear amplifier 210 and outputting an amplifier temperature indicator It 242; (iii) a memory module 260 for storing multiple sets of pre-distortion coefficient values; (iv) a retrieval module 250, coupled to the memory module 260 and to the temperature sensor 240, for receiving the amplifier temperature indicator It 242, for selecting a selected set of predetermined pre-distortion coefficient values based on the amplifier temperature indicator It 242, and for sending the selected set of predetermined pre-distortion coefficient values to a signal processing module 270; (v) signal processing module 270, configured to receive an input signal Sin 110, to receive the selected set of predetermined pre-distortion coefficient values, and to pre-distort the input signal Sin, using the selected set of pre-distortion coefficient values such as to at least partly compensate for the non-linearity of the non-linear amplifier 210. This process can also be referred to as pre-distortion, (iv) front end module 650, and (v) feedback circuit 202.

FIG. 1 also illustrates antenna 690 and additional sensor such as, power sensor 290, amplitude sensor 235, and supply voltage sensor 230.

Antenna 690 that transmits an amplified signal that is provided by the non-linear amplifier. Antenna 690 can be included in the apparatus 200 but this is not necessarily so.

Front end module 650 can include at least one digital to analog converter, at least one filters (such as low pass filters), I and Q mixers, local oscillator, 90 degree phase offset, a combiner and a gain controllable pre-amplifier. Front end module 650 receives digital signals (such as pre-distorted digital signals) from the signal processing module 140 and provides an analog signal (such as pre-distorted analog signals) to non-linear amplifier 110.

According to an embodiment of the invention the input frequency of the input signal is known in advance (for example—when operating according to a communication standard) or is provided as input to the retrieval circuit 250 without analyzing the spectrum.

Power sensor 290 is connected to an output of the non-linear amplifier 210 and measures the maximum peak power of the non-linear amplifier 210 and the average power of the non-linear amplifier. The maximum peak power is the maximal power of the amplified signal while the average power is the average power of the amplified signal. Both measurements can be made over the same periods but this is not necessarily so.

The power sensor 290 sends an amplifier maximum peak power indicator Isp 292 to the retrieval module 250. It can also send an average power indicator Iav 293 to the retrieval module.

Supply voltage sensor 230 monitors the level of the supply voltage that is supplied to the non-linear amplifier 210 by the voltage supply unit 220. The supply voltage sensor 230 sends to the retrieval module 250 a supply voltage indicator Iv 232.

Amplitude sensor 235 senses an amplitude of the input signal at multiple points in time and sends to retrieval module 250 at least one amplitude indicator Ia 234.

The retrieval module 250 selects a selected set of predetermined pre-distortion coefficient values from a data structure 262 within the memory module and sends the selected set of pre-distortion coefficient values to the signal processing module 270. The selected set of predetermined pre-distortion coefficient values can be a set of Volterra pre-distortion coefficient values, or any other known pre-distortion coefficient value that may be calculated according to any other algorithm. The selected set can be retrieved from a look up table, a non linear lookup table, can be applied by a non linear filter and the like.

The signal processing module 270 can apply additional processes such as filtering and the like. An example of such a processing can include FFT conversion.

It known to those have ordinary skill in the art that the predetermined pre-distortion coefficient values can be calibrated or measured by a receiver not shown in the figures.

The retrieval module 250 selects a selected set of pre-distortion coefficient values based on at least one of the mentioned indicators: (i) amplifier temperature indicator It 242; (ii) input signal frequency indicator Ifr 212, (iii) amplifier maximum peak power indicator Isp 292; (iv) amplifier average power indicator Iay 293; (v) supply voltage indicator Iv 232; and (vi) amplitude indicator Ia 234.

The retrieval module 250 can select a selected set of pre-distortion coefficient values out of broad range of predetermined pre-distortion coefficient values. It is not required to calculate these pre-distortion coefficient values.

According to an embodiment of the invention the retrieval module 250 uses at least one of the indicators as an index into a multi-dimensional data structure. The at least one indicators can be processed (for example—concatenated) to provide at least one pointes to the pre-distortion coefficient value data structure 262.

It is noted that signal processing module 270 may include hardware, software, and/or firmware components, and any combination thereof. It is noted that conveniently, the processing of the signal may be carried out by hardware components of signal processing module 270, such as a hardware filter.

According to an embodiment of the invention the set of pre-distortion coefficient values can include at least one pre-distortion coefficient values. For example, the set can include a single complex coefficient that is multiplied by the entire input signal (that in turn includes multiple samples). It is noted that multiplying the entire input signal by a single complex compensation coefficient (or multiplying components of the complex input signal by two real parameters, which correspond to a complex parameter) is conveniently a relatively fast and not complex way of pre-distorting the input signal.

It is noted that the signal processing module 270 can pre-distort the input signal not only to compensate for the non-linearity of the non-linear amplifier 210 but also to overcome distortions introduces by other components of the apparatus.

According to an embodiment of the invention the signal processing module 270 may not always pre-distort the input signal by a set of pre-distortion coefficient values. Preventing the pre-distortion or at least enabling a simple trivial pre-distortion that does not substantially modify the input signal may facilitate the amplification, reduce computational power, and may even reduce the number of interferences with the input signal, thus increasing a quality of the amplification.

For example, if the input signal is determined (by signal processing module 270 or a preceded module) to be of electrical parameters in which the amplification by the non-linear amplifier 210 will be substantially linear, processing may not be required.

According to an embodiment of the invention the signal processing module can elect simpler pre-distortion schemes if these simpler pre-distortion schemes will provide adequate pre-distortion. The number of pre-distortion coefficient values within different sets of pre-distortion coefficient values can differ from one to another. Thus, if it is expected that the non-linearity of the non-linear amplifier 210 is expected to be relatively low a simple pre-distorter can be applied. For example—such a simple pre-distorter can be applied at relatively low temperatures.

The pre-distortion of the input signals by the signal processing module 270 is usually a continuous operation, in which in different times (and possibly at a rate that is equal to the sampling rate of the digital input signal) different pre-distortion coefficient values are retrieved from the memory module 260, and used to process samples of the input signal at different times.

According to an embodiment of the invention at least one indicators can be used to select the selected set of pre-distortion coefficient values while at least one other indicators can be used to process (for example—multiply) the selected set of pre-distortion coefficient values that are provided to the signal processing module 270. The processing can include updating the values that are stored in the memory unit 260 by an updating module.

The different sets of pre-distortion coefficient values that are stored in the memory unit 260 represent pre-distortion coefficient values that are aimed to at least partly compensate for the non-linearity of the non-linear amplifier 210 under different conditions. Each set can provide the best, the optimal or at least reasonable pre-distortion coefficient values for certain condition (working point) of non-linear amplifier 210.

The number of factors and possible parameter values that can affect the behavior (distortion, non-linearity) of non-linear amplifier 210 can be very large and each set of pre-distortion factors can be provide at least a reasonable trade-off for a certain range of parameters.

Each indicator can be generated by using a liner or a non-linear of the sensed parameter value. The mapping between a parameter value range and the value of the indicator can be defined in various manners. Different indicator values can be assigned to parameter value ranges of the same size or of different sizes. For example, an amplifier temperature range can be segmented to even ranges, each range being associated with a unique value of the amplifier temperature indicator It 242. These temperature ranges can be of the same size but this is not necessarily so—for example—the higher temperature ranges can be smaller then the lower temperature ranges.

The different sets of pre-distortion coefficient values can be calculated in advance, during the design process of the apparatus 200 or during a pre-production testing of the apparatus 200 or during the design process of the non linear amplifier 210 or during a pre-production testing of the non linear amplifier 210. They can be calculated per batch of apparatus (to compensate for process variations), per multiple batches of the apparatus and the like.

The different sets of pre-distortion coefficient values can be updated after being initially stored in the memory module 260.

The different sets of pre-distortion coefficient values can be calculated by simulating the distortions introduced by the non-linear amplifier 210, by measuring the amplified signals Sa 140 outputted by the non-linear amplifier 210 under different conditions, and the like.

The calculation can include sending a large number of test signals to the non-linear amplifier 210, for each working point of the non-linear amplifier 210 (out of a large number of different working points), and under different pre-distortion coefficient values in order to find pre-distortion coefficient values that at least partially compensates for the behavior of the non-linear amplifier 210.

The apparatus 200 can include at least one digital region and at least one analog region.

FIG. 1 illustrates a single digital region 300 and a single Analog region 310. The digital region 300 includes digital circuits (such as memory module 260, retrieval module 250 and signal processing module 270). The analog region 310 includes analog circuits such as non-linear amplifier 210 and temperature sensor 240.

Temperature sensor 240 should sense the temperature of amplifier 210 and should be very close to the non-linear amplifier 210. It can even be integrated with the non-linear amplifier 210 in order to sense the exact temperature of non-linear amplifier 210.

This proximity allows ignoring erroneous temperature measurements or biases introduced from the ambient temperature or other components of the apparatus.

According to an embodiment of the invention the apparatus 200 includes at least one sensor (for example—temperature sensor 240 or any other sensor illustrated in FIG. 1) for sensing at least one parameter (for example—the temperature of the non-linear amplifier) that affects a non-linearity of the non-linear amplifier and for generating at least one parameter indicator (such as amplifier temperature indicator It 242).

The retrieval module 250 receives the at least one indicator and selects the selected set of pre-distortion coefficient values based on the at least one indicator. It then sends the selected set of pre-distortion coefficient values to the signal processing module 270.

Since only a finite (and possibly relatively small) number of pre-distortion coefficient values can be stored in memory unit 260 the signal processing module 270 (or even the retrieval module 250) can be configured to process the selected pre-distortion coefficient values, for example—by interpolating a selected set of pre-distortion coefficient values. The interpolation can be based on at least one sensed parameters. For example—if (i) the pre-distortion coefficient data structure 262 stores one set of pre-distortion coefficient parameter for an amplifier temperature of 18 degrees, (ii) the pre-distortion coefficient data structure 262 stores another set of pre-distortion coefficient values for an amplifier temperature of 22 degrees, and (iii) the temperature sensor 240 senses an amplifier temperature of 20 degrees then the retrieval module 250 can interpolate these two sets of pre-distortion coefficient values to provide a selected set of parameters that are sent to signal processing module 270. Alternatively, the retrieval module 250 can send both sets of selected pre-distortion coefficient values to signal processing module 270 that may interpolate them to provide pre-distortion coefficient values that will be used to pre-distort the input signal 110.

Figure 2:
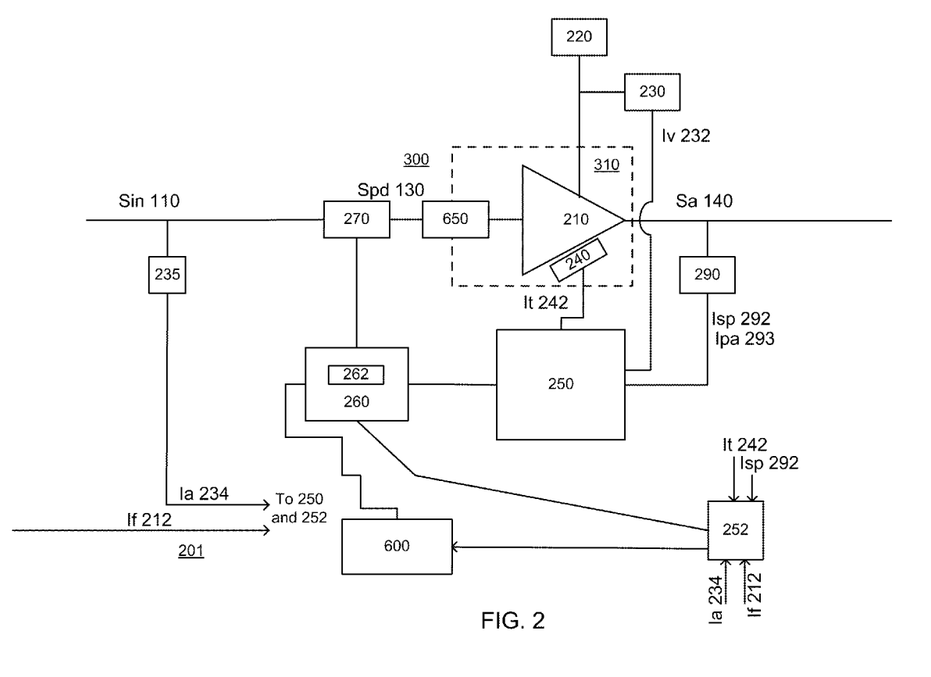
FIG. 2 illustrates an apparatus, according to an embodiment of the invention.

FIG. 2 illustrates apparatus 201 that includes an updating module 252, according to an embodiment of the invention. FIG. 2 also illustrates another storage unit 600. According to an embodiment of the invention memory unit 260 stores only a portion of pre-distortion coefficient value sets. These pre-distortion coefficient value sets fit some working points of the non-linear amplifier out of a larger group of possible working points. The content of the memory unit 260 can be refreshed by updating module 252—according to anticipated or previously sensed working points of the non-linear amplifier. In this sense the memory unit 260 can act as a cache and its content can be refreshed. The refreshing can include providing more sets of pre-distortion coefficient values (from other storage unit 600) for a certain range of working points (changing the granularity or resolution of the sets), reducing the sets of pre-distortion coefficient values for a certain range of working points, providing a set of pre-distortion coefficient parameters for a new range of working points, and the like. The other storage unit 600 can belong to apparatus (as illustrated in FIG. 2) but can belong to another apparatus.

Figure 3:
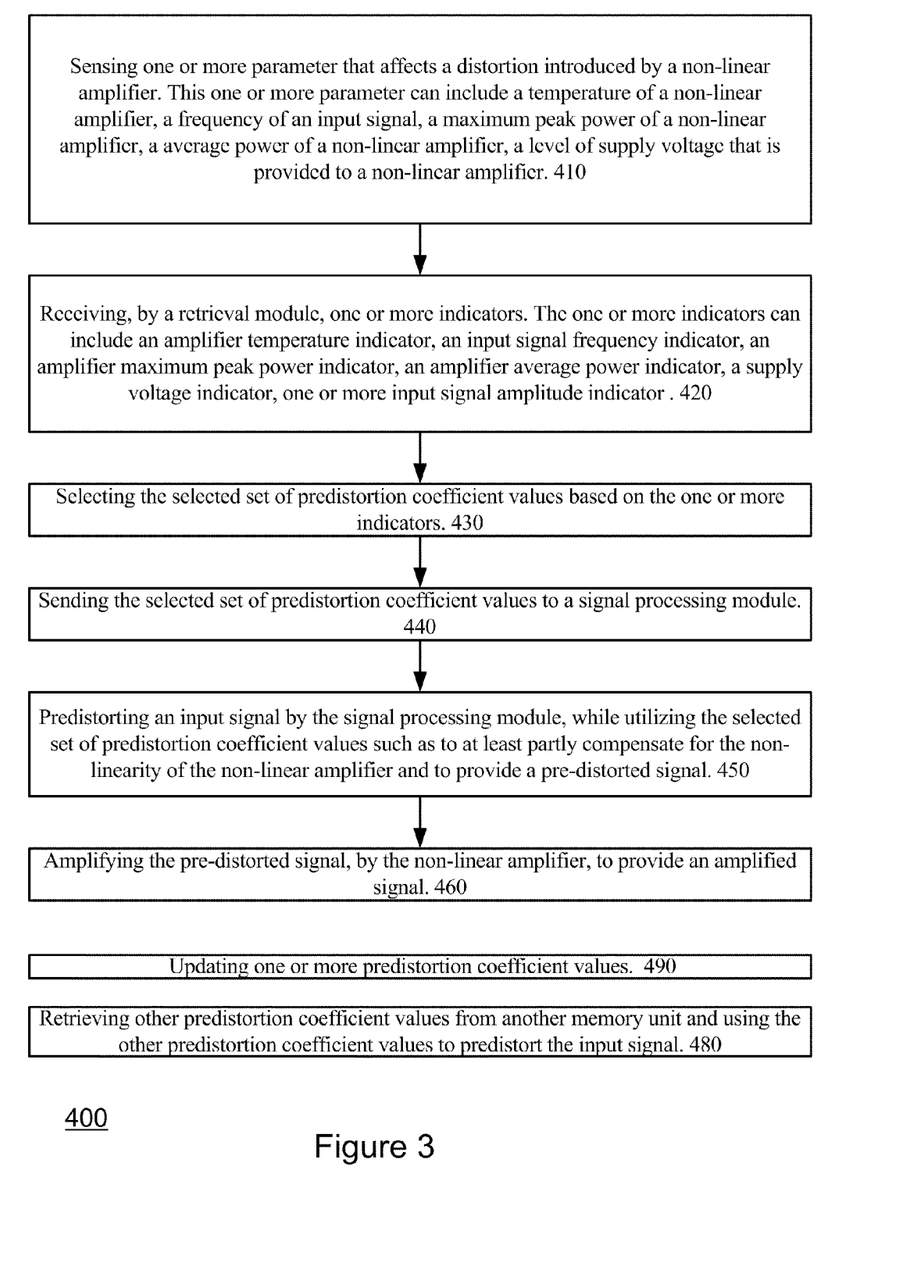
FIG. 3 illustrates a method for processing and amplifying a signal, according to an embodiment of the invention.

FIG. 3 illustrates method 400 for processing and amplifying a signal, according to an embodiment of the invention.

Method 400 starts by stage 410 of sensing at least one parameter that affects a distortion introduced by a non-linear amplifier. This at least one parameter can include a temperature of a non-linear amplifier, a frequency of an input signal, a average power of a non-linear amplifier, a maximum peak power of a non-linear amplifier, a level of supply voltage that is provided to a non-linear amplifier;

Stage 410 is followed by stage 420 of receiving, by a retrieval module, at least one indicator. The at least one indicators can include an amplifier temperature indicator, an input signal frequency indicator, an amplifier maximum peak power indicator, a supply voltage indicator, at least one input signal amplitude indicator.

Stage 420 is followed by stage 430 of selecting the selected set of pre-distortion coefficient values based on the at least one indicators.

Stage 430 is followed by stage 440 of sending the selected set of pre-distortion coefficient values to a signal processing module.

Stage 440 is followed by stage 450 of pre-distorting an input signal by the signal processing module, while utilizing the selected set of pre-distortion coefficient values such as to at least partly compensate for the non-linearity of the non-linear amplifier and to provide a pre-distorted signal.

Stage 450 is followed by stage 460 of amplifying the pre-distorted signal, by the non-linear amplifier, to provide an amplified signal.

Stage 410 of sensing can be executed by a temperature sensor that belongs to the same analog region of the apparatus as the non-linear amplifier.

Stage 410 of sensing can be executed by a temperature sensor that is integrated with the non-linear amplifier.

Due to the proximity of the temperature sensor to the non-linear amplifier stage 310 may include sensing the temperature of the non-linear amplifier even when the temperature of the non-linear amplifier differs from an ambient temperature.

According to an embodiment of the invention, the processing is preceded by determining in response to the input signal whether to process the input signal, wherein the processing is selectively carried out in response to a result of the determining.

According to an embodiment of the invention method 400 can include stage 480 of retrieving other pre-distortion coefficient values from another memory unit and using the other pre-distortion coefficient values to pre-distort the input signal.

The retrieval can be responsive to failures of the pre-distortion process, to an anticipated change in the working point of the non-linear amplifier, to at least one values of at least one indicators, and the like.

Stage 480 can include refreshing the content based on an anticipated or previously sensed working points of the non-linear amplifier, providing more sets of pre-distortion coefficient values for a certain range of working points (thereby changing the granularity or resolution of the sets), reducing the sets of pre-distortion coefficient values for a certain range of working points, providing a set of pre-distortion coefficient parameters for a new range of working points, and the like.

It is noted that method 400 may conveniently be carried out by an apparatus such as apparatus 200 and 201, or alternatively use a software module to implement this section.

Figure 4:
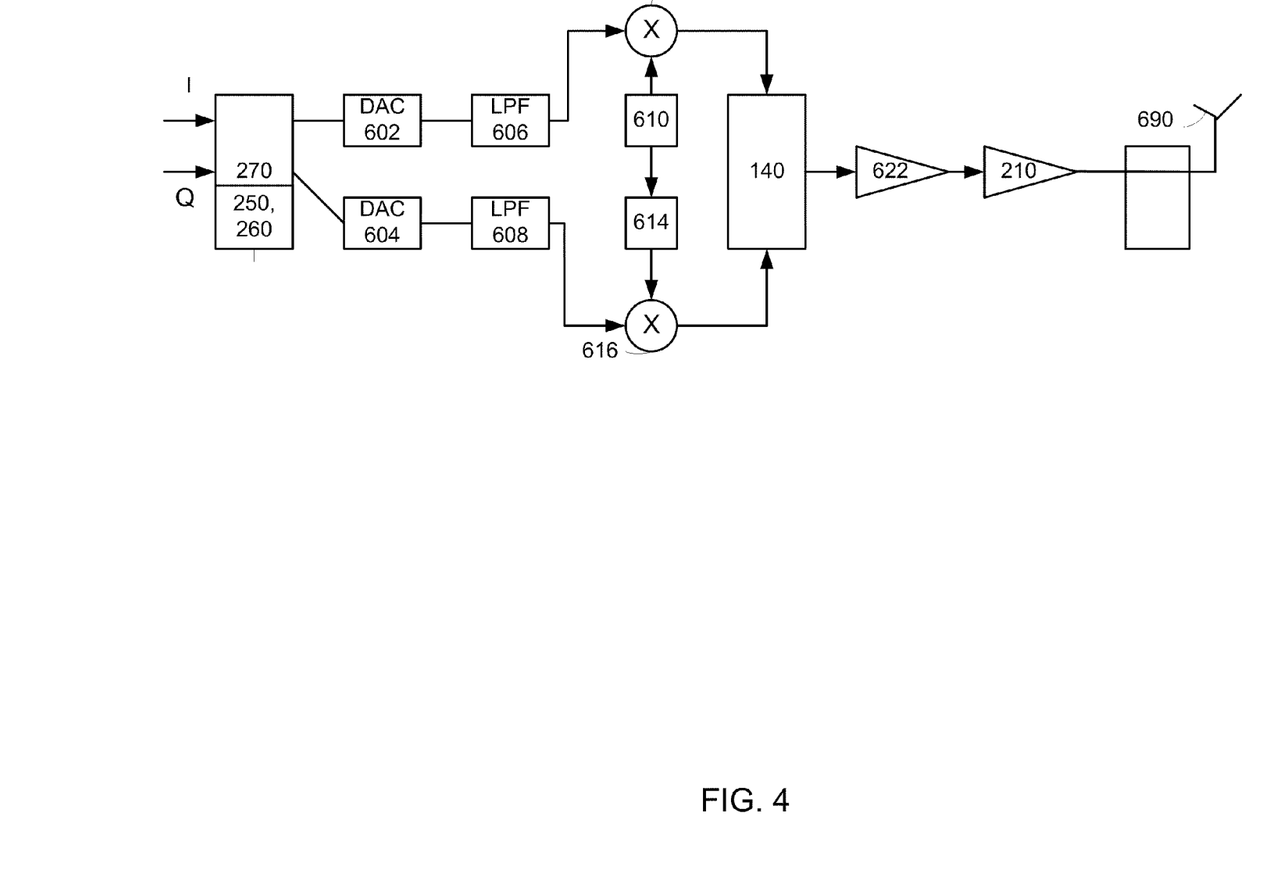
FIG. 4 illustrates an apparatus according to an embodiment of the invention.

FIG. 4 illustrates an apparatus that includes an I branch and a Q branch for processing and amplifying an I part and a Q part of an input signal.

Apparatus 108 includes non-linear amplifier 210, memory module 260, retrieval module 250, signal processing module 270 and additional components.

FIG. 4 also illustrates antenna 690 that transmits an amplified signal that is provided by the non-linear amplifier. Antenna 690 can be included in the apparatus 108 but this is not necessarily so.

FIG. 4 illustrates that signal processing module 270 processed the I part and Q part of an input signal and sends a pre-distorted I signal and a pre-distorted Q signal to a front end module that includes digital to analog converters 602 and 604, low pass filters 606 and 608, I mixer 612, Q mixer 616, local oscillator 610, 90 degree phase offset 614, combiner 140 and gain controllable pre-amplifier 622.

Digital to analog converters 602 and 604 convert these digital signals to analog signals that are provided to low pass filters 606 and 608. The analog signals that are outputted from these low pass filters are up-converted by I mixer 612, Q mixer 616, local oscillator 610 and 90 degree phase offset 614 to provide a pair of up-converted signals that are summed by combiner 140 and sent to gain controllable pre-amplifier 622. Gain controllable pre-amplifier 622 provides an analog pre-distorted signal to non-linear amplifier 210.

Figure 5:
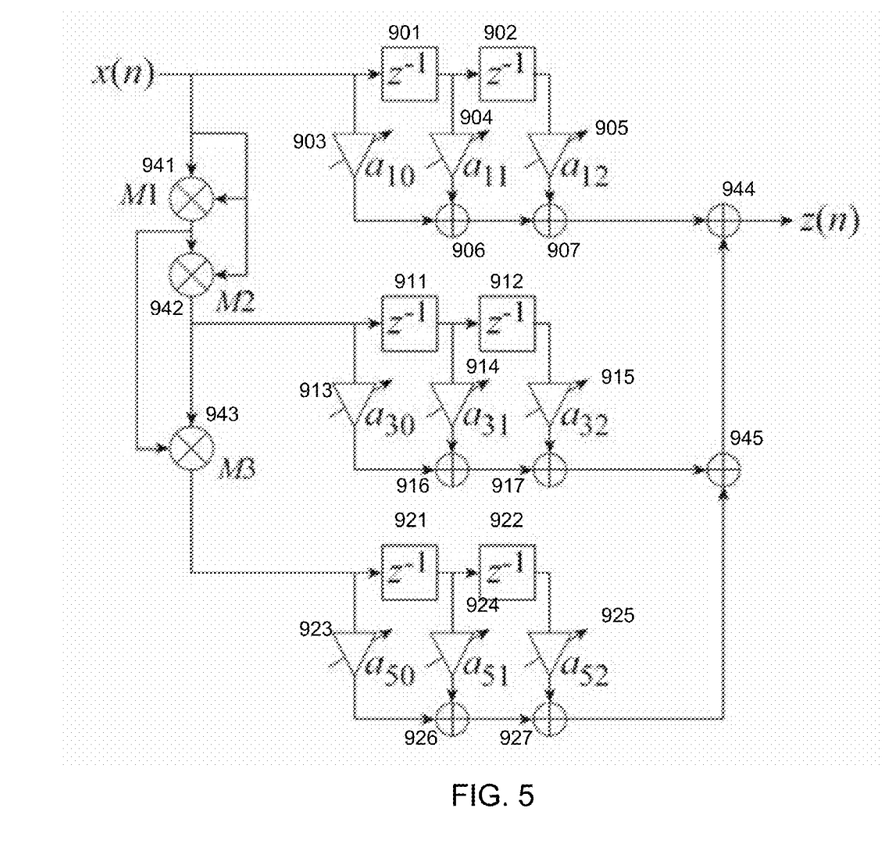
FIG. 5 illustrates a Volterra based pre-distortion process according to an embodiment of the invention.

FIG. 5 illustrates a Volterra based pre-distortion process according to an embodiment of the invention.

The Volterra based pre-distortion process is represented by delay units 901, 902, 911, 912, 921 and 921, adders 906, 907, 916, 917, 926, 927, 944 and 945, multipliers 941, 942, 943, 903, 904, 905, 913, 914, 915, 923, 924 and 925.

Multipliers 903, 904, 905, 913, 914, 915, 923, 924 and 925 are fed by pre-distortion coefficient values a10, a11, a12, a30, a31, a32, a50, a51 and a52.

The input of the Volterra pre-distortion process is denoted X(n) and the output is denoted Z(n). $Z(n)=x(n)*a10+x(n-1)*a11+x(n-2)*a12+x(n)^3*a30+x(n-1)^3*a31+x(n-2)^3*a32+x(n)^5*a50+x(n-1)^5*a51+x(n-2)^5*a52$.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method, comprising:
   sensing at least one parameter that affects a non-linearity of a non-linear amplifier;
   receiving, by a retrieval module, at least one indicator that is indicative of a sensed value of the at least one parameter;
   storing in a memory unit at least one set of predetermined pre-distortion coefficient values that fit some anticipated or sensed working points of the non-linear amplifier;
   storing in another storage unit multiple other sets of pre-determined pre-distortion coefficient value pre-distortion coefficient values that fit some other anticipated or sensed working points of the non-linear amplifier;
   selecting one set of pre-distortion coefficient values, from a group of predetermined pre-distortion coefficient value sets, based on the at least one indicators;
   wherein the selecting comprises selecting a selected set of predetermined pre-distortion coefficient values that is stored in the memory unit;
   sending the selected set of pre-distortion coefficient values to a signal processing module;
   pre-distorting an input signal by the signal processing module, while utilizing the selected set of pre-distortion coefficient values such as to at least partly compensate for the non-linearity of the non-linear amplifier and to provide a pre-distorted signal; and
   amplifying the pre-distorted signal, by the non-linear amplifier, to provide an amplified signal.

2. The method according to claim 1 comprising changing a granularity or resolution of the at least one set of predetermined pre-distortion coefficient values stored in the memory unit.

3. The method according to claim 1, comprising:
   sensing a maximum peak power of the non-linear amplifier and an average power of the non-linear amplifier;
   generating a maximum peak power indicator and a average power indicator; and
   selecting the one set of pre-distortion coefficient values from a group of predetermined pre-distortion coefficient value sets based on the maximum peak power indicator and the average power indicator.

4. The method according to claim 1, comprising: sensing a maximum peak power of the non-linear amplifier and an average power of the non-linear amplifier; and at least one other parameter selected from a group consisting of: a temperature of the non-linear amplifier; a frequency of the input signal; a level of a supply voltage that is provided to the non-linear amplifier; and an amplitude of the input signal.

5. The method according to claim 1, comprising: sensing a frequency of the input signal.

6. The method according to claim 1, comprising: sending to the signal processing module two selected sets of predetermined pre-distortion coefficient values; and
   interpolating, by the signal processing module, the two selected sets of predetermined pre-distortion coefficient values to provide a selected set of predetermined pre-distortion coefficient values.

7. The method according to claim 1 wherein a number of predetermined pre-distortion coefficient values of a first predetermined pre-distortion coefficient value set differs from a number of predetermined pre-distortion coefficient values of another predetermined pre-distortion coefficient value set.

8. The method according to claim 1 comprising sensing multiple parameters that affect the non-linearity of the non-linear amplifier;
receiving, by the retrieval module, multiple indicators that are indicative of sensed values of multiple one parameters;
selecting one set of pre-distortion coefficient values, from a group of predetermined pre-distortion coefficient value sets, based on one indicator; and
processing the selected set of pre-distortion coefficient values based on least one other indicator.

9. A method, comprising:
sensing at least one parameter that affects a non-linearity of a non-linear amplifier;
receiving, by a retrieval module, at least one indicator that is indicative of a sensed value of the at least one parameter;
interpolating two sets of predetermined pre-distortion coefficient values from a group of predetermined pre-distortion coefficient value sets to provide a selected set of predetermined pre-distortion coefficient values;
sending the selected set of pre-distortion coefficient values to a signal processing module;
pre-distorting an input signal by the signal processing module, while utilizing the selected set of pre-distortion coefficient values such as to at least partly compensate for the non-linearity of the non-linear amplifier and to provide a pre-distorted signal; and
amplifying the pre-distorted signal, by the non-linear amplifier, to provide an amplified signal.

10. The method according to claim 9 comprising converting sensed parameter values to indicator values by mapping uneven sensed parameter value ranges to indicator values.

11. An apparatus, comprising:
at least one sensor for sensing at least one parameter that affects a non-linearity of the non-linear amplifier and for generating at least one parameter indicator;
a memory module for storing multiple sets of pre-distortion coefficient values;
a retrieval module, coupled to the memory module, for receiving the at least one indicator, for selecting a selected set of pre-distortion coefficient values based on the at least one indicator, and for sending the selected set of pre-distortion coefficient values to a signal processing module; wherein a number of predetermined pre-distortion coefficient values of a first predetermined pre-distortion coefficient value set differs from a number of predetermined pre-distortion coefficient values of another predetermined pre-distortion coefficient value set; and
a signal processing module, configured to receive an input signal, to receive the selected set of pre-distortion coefficient values, and to pre-distort the input signal, using the selected set of pre-distortion coefficient values such as to at least partly compensate for the non-linearity of the non-linear amplifier.

12. The apparatus according to claim 11 further comprising another storage unit;
wherein the memory module is arranged to store at least one set of predetermined pre-distortion coefficient values that fit some anticipated or sensed working points of the non-linear amplifier;
wherein the other storage unit is arranged to store multiple other sets of predetermined pre-distortion coefficient value pre-distortion coefficient values that fit some other anticipated or sensed working points of the non-linear amplifier; and
wherein the retrieval module is arranged to select the selected set of predetermined pre-distortion coefficient values from the memory module.

13. The apparatus according to claim 11, comprising: a maximum peak power sensor for sensing a maximum peak power of the non-linear amplifier and for generating a maximum peak power indicator;
an average power sensor for sensing an average power of the non-linear amplifier and for generating an average power indicator; and
wherein the retrieval module is configured to receive the maximum peak power indicator and the average power indicator and for selecting a selected set of pre-distortion coefficient values based on the maximum peak power indicator and the average power indicator.

14. The apparatus according to claim 12 wherein the apparatus is arranged to change a granularity or resolution of the at least one set of predetermined pre-distortion coefficient values stored in the memory module.

15. The apparatus according to claim 11, comprising at least one sensor for sensing.

16. The apparatus according to claim 11, wherein the retrieval module is arranged to send to the signal processing module two selected sets of predetermined pre-distortion coefficient values;
and wherein the signal processing module is arranged to interpolate the two selected sets of predetermined pre-distortion coefficient values to provide a selected set of predetermined pre-distortion coefficient values.

17. The apparatus according to claim 11, comprising:
a temperature sensor for sensing a temperature of a non-linear amplifier and for generating an amplifier temperature indicator,
sensors for sensing:
a maximum peak power of the non-linear amplifier;
an average power of the non-linear amplifier;
a frequency of the input signal;
a level of a supply voltage that is provided to the non-linear amplifier; and
an amplitude of the input signal.

18. The apparatus according to claim 11, wherein the at least one sensor is arranged to sense multiple parameters that affect the non-linearity of the non-linear amplifier;
wherein the retrieval module is arranged to receive multiple indicators that are indicative of sensed values of multiple one parameters and to select one set of pre-distortion coefficient values, from a group of predetermined pre-distortion coefficient value sets, based on one indicator; and
wherein the signal processing module is arranged to select the selected set of pre-distortion coefficient values based on at least one other indicator.

19. The apparatus according to claim 18 wherein the retrieval module is arranged to interpolate two sets of predetermined pre-distortion coefficient values to provide selected set of predetermined pre-distortion coefficient values.

20. The apparatus according to claim 11, wherein the system is arranged to convert sensed parameter values to indicator by mapping uneven sensed parameter value ranges to indicator values.

* * * * *